United States Patent [19]

Foust et al.

[11] Patent Number: 4,999,251
[45] Date of Patent: Mar. 12, 1991

[54] METHOD FOR TREATING POLYETHERIMIDE SUBSTRATES AND ARTICLES OBTAINED THEREFROM

[75] Inventors: Donald F. Foust, Scotia; William V. Dumas, Delanson, both of N.Y.

[73] Assignee: General Electric Company, Schenectady, N.Y.

[21] Appl. No.: 331,715

[22] Filed: Apr. 3, 1989

[51] Int. Cl.$^5$ .............................................. C23C 26/00
[52] U.S. Cl. .................................. 428/458; 428/35.8; 427/304; 427/306
[58] Field of Search ............... 427/304, 306; 428/458, 428/35.8; 525/420

[56] References Cited

U.S. PATENT DOCUMENTS

| | | | |
|---|---|---|---|
| 3,881,049 | 4/1975 | Brandt | 428/458 |
| 4,054,693 | 10/1977 | Leech et al. | |
| 4,425,380 | 1/1984 | Nuzzi et al. | |
| 4,515,829 | 5/1985 | Deckert et al. | |
| 4,592,852 | 6/1986 | Courduvelis et al. | |
| 4,592,929 | 6/1986 | Tubergen | 427/306 |
| 4,610,895 | 9/1986 | Tubergen et al. | |
| 4,629,636 | 12/1986 | Courduvelis et al. | |
| 4,725,504 | 2/1988 | Knudsen | 428/458 |
| 4,775,449 | 10/1988 | Dumas | 427/304 |
| 4,842,946 | 6/1989 | Foust | 427/304 |
| 4,873,136 | 10/1989 | Foust | 427/304 |

FOREIGN PATENT DOCUMENTS 3708214 8/1988 Fed. Rep. of Germany.
74351 5/1983 Japan .................................. 428/458

OTHER PUBLICATIONS

R. B. Webber, "The Book of pH" George Newnes Limited 1957, pp. 8, 9, 84.
Douglas M. Considine "Encyclopedia of Chemistry" Van Nostrand Reinhold Company 1984, pp. 705–706.
A. Piano et al., Solvent Swell, 4/88, P C Fab, pp. 63–66.
F. Tomaiuolo, Etchback/Desmearing Overview, 4/88, PC Fab, pp. 68–77.

Primary Examiner—Shrive Beck
Assistant Examiner—Vi Duong Dang
Attorney, Agent, or Firm—William A. Teoli; James C. Davis, Jr.; William H. Pittman

[57] ABSTRACT

The method is provided for treating the surface of a polyetherimide substrate to improve its adhesion characteristics for electrolessly deposited metal, such as copper. There is employed a series of surface treatments including the initial immersion of the polyetherimide substrate in sulfuric acid, contact with aqueous base, such as potassium hydroxide, followed by oxidation with an alkali metal permanganate such as potassium permanganate, and surface treatment with a reducing agent, such as a hydroxylamine salt. Polyetherimide metal composites are also provided.

11 Claims, No Drawings

4,999,251

METHOD FOR TREATING POLYETHERIMIDE SUBSTRATES AND ARTICLES OBTAINED THEREFROM

CROSS REFERENCE TO RELATED APPLICATION

Reference is made to co-pending application Ser. No. 103,618, filed 9/28/87, now U.S. Pat. No. 4,842,946 for Method For Treating A Polyimide Surface To Improve The Adhesion Of Metal Deposited Thereon And Articles Produced Thereby and copending application Ser. No. 207,462, filed 6/16/88, now U.S. Pat. No. 4,873,136 for Improved Method For Preparing Polymer Surfaces For Subsequent Plating Thereon, And Improved Metal Plated Plastic Articles Made Therefrom, which are assigned to the same assignee as the present invention and incorporated herein by reference.

BACKGROUND OF THE INVENTION

The present invention relates to a method for treating polyetherimide surfaces to improve their adhesion characteristics to metal, such as copper, after the metal has been electrolessly deposited onto such molded or extruded polyetherimide surfaces.

Prior to the present invention, as shown by co-pending application Ser. No. 103,618, improved adhesion was achieved on a polyetherimide surface by treating the polyetherimide surface with an adhesion promoter such as thiourea. However, it has been found that thiourea can discolor copper inserts in a molded polyetherimide circuit board resulting in poor bonding between the copper insert and the electrolessly plated copper. In co-pending application Ser. No. 207,462, improved adhesion of the polyetherimide surface is achieved by initially modifying the surface of the polyetherimide with a mild etchant, such as sulfuric acid, contacting the modified surface with a basic solution followed by contacting the treated surface with a cationic surfactant which effects the removal of a residual film formed on the surface after the sulfuric acid step. Removal of the residual film or white residue is essential to optimize the adhesion of any subsequently applied electrolessly deposited metal onto the plastic substrate. Although effective results have been achieved by the employment of a cationic surfactant, it has been found that the concentration of the white residue resulting from sulfuric acid immersion followed by a water rinse, can actually increase in the solubilizing bath, since the white residue is merely solubilized not chemically altered. As a result, treatment of the polyetherimide surface with the aqueous cationic surfactant can eventually result in reduced adhesion of the electrolessly deposited metal on the polyetherimide surface.

SUMMARY OF THE INVENTION

It would be desirable to provide a procedure to treat the surface of an extruded or molded polyetherimide to allow for the production of metal-plastic composites. More particularly, it would be desirable to provide a method for making metal-plastic composites by electroless metal deposition to achieve superior adhesion between the electrolessly deposited metal and the plastic substrate. It also would be desirable to avoid discoloration between copper inserts in molded or extruded polyetherimide plastic substrates resulting from the employment of adhesion promoters, such as thiourea.

The present invention is based on the discovery that the non-adherent white film formed on the surface of a molded or extruded polyetherimide resulting from sulfuric acid immersion can be chemically modified by rinsing the treated polyetherimide substrate with water and an aqueous basic solution, such as alkali metal hydroxide solution, followed by immersing the resulting treated plastic substrate into an aqueous alkali metal permanganate solution. The resulting treated substrate, after it has been subjected to a water rinse is found to be completely free of the white residue, normally formed from the sulfuric acid treatment. However, a brown manganese residue remains on the plastic surface. The brown manganese residue is readily removed by immersing the polyetherimide substrate into an aqueous solution of a reducing agent, such as hydroxylamine hydrochloride. Surprisingly, the resulting treated polyetherimide substrate provides excellent adhesion between electrolessly deposited metal, such as copper, and the polyetherimide substrate without the use of an adhesion promoter, such as thiourea.

STATEMENT OF THE INVENTION

There is provided by the present invention, a method for modifying the surface of a polyetherimide substrate to improve its adhesion characteristics toward electrolessly deposited metal, which comprises, (A) treating the surface of the polyetherimide substrate with a degreasing agent, (B) modifying the degreased polyetherimide surface with concentrated sulfuric acid, (C) treating the modified polyetherimide surface with an aqueous base having a pH of 14 or greater, (D) oxidizing the resulting polyetherimide surface with an alkali metal permanganate resulting in the production of a manganese oxide residue, and (E) effecting the removal of the manganese oxide residue from the polyetherimide surface by treating the polyetherimide surface with a reducing agent.

In a further aspect of the present invention there is provided a molded or extruded polyetherimide substrate having at least a portion of its surface initially degreased, modified in sulfuric acid, treated with an aqueous base having a pH of 14 or greater, oxidized with an aqueous $MnO_4^-$ source material, and thereafter treated with a reducing agent.

In an additional aspect of the present invention, there is provided a metallized polyetherimide substrate or polyetherimide printed circuit board, comprising a polyetherimide substrate and electrolessly deposited metal applied thereon in a patterned or unpatterned manner, where the polyetherimide substrate has been initially degreased, modified in sulfuric acid, treated with an aqueous base having a pH of 14 or greater, oxidized with an aqueous $MnO_4^-$ source material, and thereafter treated with a reducing agent.

As used thereinafter, the terms "degreased" means a polyetherimide substrate having its surface free of oil, molding compounds, finger prints or extraneous material.

As used thereinafter the expression "modified with sulfuric acid" means treating the surface of the polyetherimide, by immersion, spraying, painting, or other forms of surface treatment with an aqueous solution of hydrogen sulfate having a concentration of from 80% to 99%, at a temperature of 0° C. to 85° C. for from 10 seconds to 30 minutes.

Among the polyetherimides which can be employed in the practice of the present invention are polymers shown by Heath et al U.S. Pat. No. 3,847,867 assigned to the same assignee as the present invention and incorporated herein by reference. Additional polyetherimides which can be used in the practice of the present invention are shown by Takekoshi et al U.S. Pat. No. 3,803,085 assigned to the same assignee as the present invention and incorporated herein by reference. The preferred polyetherimide used in the practice of the method of the present invention can be made by condensing 2,2-bis[4-(3,4-dicarboxyphenoxy) phenyl] propane dianhydride with metaphenylene diamine in an extruder reactor under neat conditions. The resulting polyetherimide can be readily injection molded to a variety of complex shapes including substrates for circuit boards or extruded and cut to size in the form of film having a thickness of 0.5 to 25 mil. The polyetherimides may contain various amounts of fillers or reenforcing agents such as talc, mica, aluminum silicate, zinc oxide, titanium dioxide, carbon black, glass fibers, glass spheres, carbon fibers and mixtures thereof. Polyetherimides also can be melt blended with silicone-polyimide polymers as shown by abandoned application of John Rock et al, Ser. No. 925,916 filed Nov. 3, 1986 assigned to the same assignee as the present invention. In addition to the aforementioned fillers, the polyetherimides also can contain additional additives such as pigments, ultraviolet radiation absorbing agents, impact modifiers, plasticizers, microwave absorbing agents, stabilizers, processing aids, and anti static agents.

The polyetherimide substrate of the present invention can be in the form of a printed circuit board having flat or curved surfaces, which can include cavities, copper inserts such as pins or heat sinks, raised and recessed regions and through-holes. In addition, the polyetherimide can be in the form of a multi-level circuit board. Further, the polyetherimide can be shaped in specific designs such as coffee pots, thin films to provide flexible circuitry, or thin films adaptable to being incorporated as part of other molded shapes.

The polyetherimide can be initially degreased with a degreasing agent such as detergent, or a suitable organic solvent, such as a halo hydrocarbon for example a Freon solvent, such as 1,1,2-trichlorotrifluoroethane. After the initial degreasing step, the polyetherimide can be modified with concentrated sulfuric acid as previously defined.

A residual film of varying thicknesses can be formed on the polyetherimide surface during the sulfuric acid treatment step. The film may remain on the surface of the polyetherimide even after rinsing. The film can be treated with an aqueous base of pH greater than 14, such as an aqueous basic solution of 0.1 M to about 10 M of an alkali metal hydroxide, such as sodium hydroxide, potassium hydroxide, In addition to alkali metal hydroxide, there is included tetramethylammonium hydroxide. The aqueous base hydroxide treatment preferably is effected at room temperature. A water rinse can be used if desired.

The surface of the resulting polyetherimide can then be immersed into an aqueous solution of an alkali metal hydroxide and alkali metal permanganate at a temperature of 25° C. to 85° C. for a period of 2 to 20 minutes. The use of an alkali metal hydroxide, as previously defined, with the alkali metal permanganate is optional. The permanganate oxidizing solution can contain from 1 to 75 grams of the alkali metal permanganate, per liter of solution for effective results the substrate can then be removed from the bath for a water rinse. The rinse can be effected by immersing the treated substrate in water, or by spraying or brushing. The alkali metal permanganate preferably includes potassium or sodium permanganate.

Following the water rinse, a brown manganese containing film can be present on the surface of the rinsed polyetherimide substrate. It has been found effective at this time to treat the polyetherimide with a reducing agent such as an aqueous solution of hydroxylamine hydrochloride by immersing the polyetherimide substrate into the reducing bath. Additional reducing agents which can be used are for example solution of 1 to 10% of stannous chloride in 5% HCl, an aqueous solution of 1 to 30% by weight of hydrogen peroxide, Shipley Circuposit MLB Neutralizer 216, a 1 to 30% solution of sodium bisulfite, etc. The resulting polyetherimide substrate can then be rinsed and allowed to dry to form a polyetherimide substrate having a chemically altered surface rendering it hydrophilic. In addition, it has been found to have a slightly higher $\equiv$C—O— content possibly indicating increased formation of carboxylic acid, ether, and/or alcohol groups. Its modified surface is capable of being activated even after an extended period of time with a tin-palladium colloid in a standard manner and metallized with an electrolessly deposited metal such as copper. Superior adhesion between the deposited metal and the polyetherimide surface can be achieved.

It is often useful to begin the activation of the substrate by treatment with an additive which aids in absorption of the plating catalyst. Such additives are well-known in the art. Exemplary aids to catalyst absorption include Shipley 1175A, a product of the Shipley Company, and Metex 9420, a product of the MacDermid Corporation. Immersion in about 0.1% to about 5% by volume of either of these agents in water for about 1 minute to about 10 minutes at a temperature of from about 40° C. to about 80° C. is usually sufficient. Although such a treatment is not deemed critical to the present invention, its use often enhances the uniform deposition of electrolessly-applied metals onto the substrate.

Activation of the polyetherimide substrate for plating purposes can be achieved by well known methods of the art. For example, the substrate may be contacted with an acid solution of a precious metal, such as palladium chloride in hydrochloric acid, for a period of time sufficient to cause catalytic activation of the substrate surface.

One illustrative activation technique involves immersing the substrate in a solution of Shipley Cataprep ® 404, a product of the Shipley Company. This solution provides a protecting agent for the plating catalyst subsequently applied, and comprises sodium bisulfate and various surfactants. The substrate may then be immersed in a solution of Shipley Cataposit ® 44, which contains the Cataprep ® 404 ingredients, tin, and palladium, which is the electroless plating catalyst. After a water rinse, the substrates may then be immersed in a solution of Shipley Cuposit ® Accelerator 19, a fluoroboric acid-containing formulation used to separate tin from the plating catalyst.

Activation and plating processes suitable for the present invention are also described in the application of W. T. Grubb et al, Ser. No. 944,728, filed Dec. 22, 1986 now abandoned, and incorporated herein by reference, and in U.S. Pat. Nos. 3,011,920 and 3,841,881, issued to Shipley and Feldstein et al, respectively, both of which are also incorporated herein by reference. A water rinse generally follows the activation step.

After surface activation and rinsing, electroless plating can be undertaken. Illustrative metals used to form the metallization layer include copper, palladium, nickel, cobalt, and gold. Copper is usually the metal of choice when forming a printed circuit. Electroless baths are well-known in the art and are generally described in the *Kirk-Othmer Encyclopedia of Chemical Technology*, 3rd Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular polyetherimide serving as the substrate, and also upon the particular metal being deposited thereon. Suitable copper plating baths include the Shipley Cuposit ® 250 system and the Enthone ® 406 system. Immersion times, bath temperatures, and other operating parameters can be determined and controlled according to manufacturers' suggestions. Those having ordinary skill in the plating arts will be able to determine the most appropriate plating procedure for a particular situation.

The polyetherimide surface can be subjected to a heat treatment after electroless deposition of the metal. Oven heating of the entire article, i.e., substrate with metal thereon, is sufficient, although any heating method is suitable. Typically, this heat treatment is carried out at a temperature ranging from about 50° C. to about 170° C. for about 5 minutes to about 120 minutes, with higher temperatures within the above range generally compensating for shorter duration, and vice versa. Although the mechanism is not understood, the heat treatment appears to reduce the time required to attain optimal adhesion.

If another layer of metal is to be applied on the surface, e.g., by electroplating, the above-described heat treatment can in some instances be omitted if a heat treatment is employed after the plating of more of the metal, as described below. However, preferred embodiments include the heat treatment prior to deposition of more of the metal. Most preferred embodiments include a heat treatment prior to the deposition of more of the metal (i.e., after the electroless deposition), along with another heat treatment after the final layer of metal has been applied, as described below.

Electroplating is the preferred application method for the second metal layer. The substrate is usually cleaned prior to immersion in the electroplating bath. The cleaning can be performed by rinsing the substrate with a dilute solution of a strong acid, such as 10% by weight sulfuric acid in water.

Electroplating baths are well-known in the art and are described, for example, in U.S. Pat. No. 4,555,315, incorporated herein by reference, although the particular electroplating bath used is not critical to the present invention. The choice of course depends in part on the particular metal being deposited. Suitable metals include those described for the electroless deposition. Furthermore, those skilled in the art appreciate that the particular bath contents will depend upon some of the factors considered for the electroless deposition of metal described above. Typically, the electroplating bath for copper is operated at a temperature ranging from about 16° C. to about 38° C., with a cathode current density in the range of about 1 amps/sq.ft.(ASF) to about 80 ASF. A description of baths for plating copper or various other metals is given in the Kirk-Othmer reference described above, in Vol. 8, beginning on page 826. Baths used to apply a layer typically include an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the desired end use of the metal-coated substrate.

The metal applied onto the polyetherimide substrate may be in the form of a pattern. Exemplary patterning methods are also described in U.S. Pat. No. 3,562,005, issued to DeAngelo et al and incorporated herein by reference.

The electrolytic layer applied on top of the electrolessly-applied layer can be substantially free of chemical additives normally present in an electrolytic layer, such as levelling agents and brighteners. The electrolytic plating bath used for this deposition is thus sometimes referred to herein as a "nonadditive" bath and more particularly discussed in copending application Ser. No. 207,462 filed 6/16/88 now U.S. Pat. No. 4,873,136. It has been found that the omission Encyclopedia of Chemical Technology, 3rd Edition, Volume 8, of these additives result in a high level of adhesion between the polyetherimide surface and the electrolessly-applied metal layer.

A heat treatment may be utilized at this stage. A typical heating regimen would be about 1 hour to about 24 hours at about 50° C. to about 150° C.

The metallization layer applied from a solution without chemical additives usually has a nodular, somewhat rough appearance. While such a surface may be suitable for some end uses, a smooth, level surface is desired for others. A smooth surface can be achieved by the deposition of a second electrolytic layer, which contains chemical additives, on top of the first electrolytic layer. The bath used to apply this layer is sometimes referred to herein as an "additive" bath.

An etching agent is often used prior to the deposition of this second electrolytic layer. Examples of etching agents include ammonium or sodium persulfate, and a mixture of hydrogen peroxide and sulfuric acid. A water rinse usually follows the etching step. The surface is then rinsed again with a dilute solution of a strong acid in order to remove residual oxides of the plated metal. An example of this last-mentioned step would be an immersion of the substrate in a 1% of weight to about 10% by weight aqueous sulfuric acid solution for about 10 seconds to about 120 seconds. The substrate is now ready for further plating.

The electrolytic bath for the second electrolytic layer can be one of the conventional baths known in the art. These baths contain effective amounts of brighteners and levelling agents, as well as other additives, all of which are known in the art and are described, for example, in *Decorating Plastics*, edited by James M. Margolis, Hanser Publishers, 1986; by J. D. Reid and A. P. David in *Plating and Surface Finishing*, January 1987, pp. 66–70; in *Modern Electroplating*, edited by Frederick A. Lowenheim, Third Edition, John Wiley and Sons, Inc.; and in the United Kingdom Patent application of D. Morrissey et al, GB2123036A. Examples of other chemical additives are stress relievers, depolarizers, plating suppressors, and wetting agents, as well as agents used for hardening, grain refining, reducing trees, and limiting current density. Thus, the term "chemical additives" as used herein is meant to include any of the above-mentioned agents.

After deposition of the second electrolytic layer, the substrate is rinsed again with water and then heat-treated to further enhance adhesion of the metal layers to the substrate. A typical heat treatment for this step can involve temperatures ranging from about 50° C. to about 150° C. for a time period ranging from about 1 hour to about 24 hours. This heat treatment obviates the heat treatment used after the first electrolytic deposition.

The result of the second electrolytic deposition can be a smooth, bright metal layers characterized by a high level of adhesion of the polyetherimide substrate.

In preferred embodiments, an article prepared by the method of this invention usually has an electroless metallization layer which is about 0.25 micron to about 2 microns thick; a first electrolytically-applied layer of at least about 5 microns; and a second electrolytically-applied layer having a thickness of at least about 5 microns.

Articles of various embodiments of this invention are suitable as printed circuit boards which would contain metallic layers as described herein in a printed circuit pattern or "trace".

Adhesion of the metal to the substrate was evaluated by measuring the force necessary to peel strips of the metal from the substrate surface. In the test, the metal surface of each plated sample is etched into ⅛ inch strips. An end of each strip is clipped to an Ametek digital force measuring gauge which is connected to a computer processor. Force values required to lift the metal strips from the substrate are converted by the computer into pounds per inch peel values. Multiple peel values for each strip are obtained and then averaged.

In order that those skilled in the art will be better able to practice the present invention, the following examples are given by way of illustration and not by way of limitation.

EXAMPLE 1

A 1 inch by 6 inch by 0.062 inch molded polyetherimide slab having a specific gravity of 1.27 was treated as follows:
2 minutes in 1,1,2-trichlorotrifluoroethane Dry
0.5 minute in concentrated sulfuric acid, 23° C.
2 minute water rinse
5 minutes in KOH(5 M), 23° C.
5 minutes in $KMnO_4$(15/g/L),KOH(1.2 N), 75° C.
2 minute water rinse
5 minutes in $NH_2OH.HCl$(2.5%), 23° C.
2 minute water rinse The polyetherimide slab was examined by X-ray photoelectron spectroscopy to a depth of about 50 Å as shown by the following table:

TABLE I

| X-Ray Photoelectron Spectroscopy Data | | | | | |
|---|---|---|---|---|---|
| Treatment | C | N | O | S | Mn |
| Theoretical untreated | 82.4 | 4.4 | 13.3 | — | — |
| After $H_2SO_4$ | 79.5 | 4.0 | 14.3 | 1.4 | — |
| After KOH | 78.6 | 3.8 | 15.0 | 0.8 | — |
| After $KMnO_4$ | 45.2 | 0.9 | 40.1 | — | 8.8 |
| After $NH_2OH.HCl$ | 80.8 | 3.5 | 15.2 | — | — |

The polyetherimide slab was then immersed for 5 minutes in Shipley 1175A at a temperature of 65° C. There was utilized about 2½% by volume of the agent in the conditioning mixture. The substrate was then rinsed for 2 minutes in water, then immersed for 1 minute in a bath containing 270 grams of Shipley Cataprep ® 404, per liter of water. The substrate was then immersed in a bath for 3 minutes at 44° C. containing 1.5 volumes of Shipley Cataposit ® 44, per 100 volumes of Shipley Cataposit ® 404 solution. The substrate was then rinsed for 2 minutes.

The treated substrate was then immersed for 3 minutes in a bath of 20 volumes of Shipley Cuposit ® Accelerator 19, per 100 volumes of water. The substrate was then rinsed for 2 minutes. The substrate was then immersed in a bath at 48° C. for 30 minutes of Shipley Cuposit ® 250 which consists of distilled or deionized water—81.2% by volume, CUPOSIT 250M—12.0% by volume, CUPOSIT 250A—3.0% by volume, CUPOSIT Z—2.3% by volume, and CUPOSIT Y—1.5% by volume . There was obtained a composite of the polyetherimide substrate and electrolessly deposited copper having an average thickness of about 0.05 mils.

The composite was then removed from the electroless plating bath and rinsed in water for 2 minutes and then heated in water 95° C. for 2 hours. The same procedure was repeated to produce additional composites of various polyetherimide and electrolessly deposited copper. The polyetherimide slabs were reinforced with various filler. The different composites were then separately immersed in an electroplating bath for 1 hour at 25° C. The electroplating bath consisted of an aqueous solution of 125 g/liter of $CuSO_4.5H_2O$, 60 g/liter of $H_2SO_4$ and 50 ppm of chloride in the form of HCl. It was run at a current density of 36A/sq.ft. The resulting composites had about 1.67 mil of electrolytically deposited copper. The composites were then heat treated for 16 hours at 95° C. Adhesion of the copper metal to the substrate was evaluated by measuring the force necessary to peel ⅛th inch strips of metal from the substrate surface. The ⅛th inch strips were prepared by a patterning technique using nitric acid as an etchant. The end of each metal strip was clipped to an AMETEK digital force measuring gauge connected to a computer processor. The force values to lift the metal strips from the polyetherimide substrate were converted by the computer to pounds per inch peel values. Multiple peel values were obtained for each strip. In Table II below, there is shown average adhesion values for the respective polyetherimides blended with various fillers. The silicone-polyimide used as a filler is shown by abandoned application Ser. No 925,916 of John Rock et al filed Nov. 3, 1986.

TABLE II

| Adhesion Data | |
|---|---|
| Filler (Wt. %) | Average Adhesion (lb/in) |
| — | 8.1 |
| 20% glass | 9.7 |
| 30% glass | 9.4 |
| 30% glass/15% $TiO_2$ | 7.7 |
| 30% glass/1.5% carbon black | 7.2 |
| 20% Mica | 6.8 |
| 15% Silicone-polyimide | 9.6 |

TABLE III

Adhesion Data For Various Manganese Removers

| Compound | Average Adhesion (lb/in) |
| --- | --- |
| None | 8.0* |
| 5% SnCl$_2$/5% HCl | 9.8 |
| 5% H$_2$O$_2$ | 12.8 |
| Shipley Circuposit MLB Neutralizer 218** | 12.2 |
| 5% NH$_2$OH.HCl | 12.6 |
| Shipley Circuposit MLB Neutralizer 216*** | 11.4 |
| 5% NaHSO$_3$ | 10.6 |
| Shipley Neutraclean 68**** | 11.3 |

*Manganese not removed until immersion in the palladium/tin colloid
**Peroxide based
***Hydroxlamine based
****Sodium bisulfite based The above results show that a variety of reducing agents can be used in addition to the hydroxylamine hydrochloride to achieve optimum adhesion results.

EXAMPLE 3

Polyethermide composites made in accordance with example 2, using the NH$_2$OH.HCl manganese remover were initially rinsed with a 10% by weight solution of sulfuric acid in water. The polyethermide composites were then electroplated.

The composites were initially immersed in an electrolytic copper bath as described in example 1, (Non Additives at 25° C. for a period of up to 60 minutes (Additives). A current density of 36 ASF was used. Composites were also electroplated following the same procedure in an electrolytic copper bath containing Lea Ronal Copper Gleam PCM Plus, a brightener, for a total electroplating time of 60 minutes. The following adhesion results were obtained following the same adhesion test procedure of example 1:

TABLE IV

Effect of Electrolytic Copper Overlayer on Polyetherimide/Electroless Copper Adhesion

| Thickness of Non Additive Electrolyte Copper* | | Thickness of Additive Electrolytic Copper** | | Average Adhesion (lb/in) |
| --- | --- | --- | --- | --- |
| Immersion Time (hr) | (mil) | Immersion Time (hr) | (mil) | |
| | 0.0 | 1 | 1.67 | 6.6 |
| 1/12 | 0.14 | 11/12 | 1.53 | 12.4 |
| 1/6 | 0.28 | 5/6 | 1.39 | 12.5 |
| ¼ | 0.42 | ¾ | 1.25 | 11.0 |
| ½ | 0.83 | ½ | 0.83 | 11.2 |
| 1 | 1.67 | 0 | 0.0 | 11.1 |

*115 g/L CuSO$_4$.5H$_2$O, 60 g/L H$_2$SO$_4$, 50 ppm chloride.
**Lea Ronal Copper Gleam PCM Plus.

Although the above examples are directed to only a few of the very many variables which can be used in the practice of the method of the present invention, it should be understood that the present invention is directed to the use of a much broader variety of polyetherimides, fillers for such polyetherimides, reducing agents and conditions used in the formation of the treated polyetherimide substrates and composites made therefrom as set forth in the description preceding these examples.

What is claimed is:

1. A method for modifying the surface of a polyetherimide substrate to improve its adhesion characteristics for electrolessly deposited metal without the use of an adhesion promoter which consists essentially of
   (A) treating the polyetherimide surface with a degreasing agent,
   (B) modifying the degreased polyetherimide surface with concentrated sulfuric acid.
   (C) treating the modified polyetherimide surface with an aqueous base to provide a pH of 14 or above,
   (D) oxidizing the resulting polyetherimide surface of (C) with alkali metal permanganate resulting in the production of a manganese oxide residue, and
   (E) effecting the removal of the manganese oxide residue from the polyetherimide surface by treating the polyetherimide surface with a reducing agent.

2. A method in accordance with claim 1, where the polyetherimide is reinforced with glass fiber.

3. A method in accordance with claim 1, where the reducing agent is hydroxylamine hydrochloride.

4. A method in accordance with claim 1, where the alkali metal permanganate is potassium permanganate.

5. A method in accordance with claim 1, where the degreasing agent is 1,1-2-trichlorotrifluoroethane.

6. Metallized polyetherimide composite comprising a polyetherimide substrate having electrolessly deposited metal patterned thereon, where the polyetherimide substrate has been treated in accordance with claim 1.

7. A polyetherimide substrate having a thickness of 0.5 to 25 mils treated in accordance with the method of claim 1.

8. A composite in accordance with claim 6 having metal electrolytically deposited on the surface of the electrolessly deposited metal.

9. A composite in accordance with claim 6 having electrolytically deposited copper on electrolessly deposited copper.

10. A circuit board in accordance with claim 6.

11. A coffee pot in accordance with claim 6 have electrolessly deposited metal on its base.

* * * * *